United States Patent [19]

Tsuda

[11] Patent Number: 5,426,331
[45] Date of Patent: Jun. 20, 1995

[54] SEMICONDUCTOR DEVICE WITH MULTI-LAYERED HEAT-RESISTIVE ELECTRODE IN TITANIUM-TITANIUM NITRIDE-PLANTINUM-GOLD SYSTEM

[75] Inventor: Hiroshi Tsuda, Tokyo, Japan
[73] Assignee: NEC Corporation, Tokyo, Japan
[21] Appl. No.: 210,176
[22] Filed: Mar. 17, 1994
[30] Foreign Application Priority Data Mar. 19, 1993 [JP] Japan ................... 5-059797

[51] Int. Cl.⁶ ............ H01L 23/48; H01L 29/40; H01L 29/46; H01L 29/54
[52] U.S. Cl. ................... 257/767; 257/763; 257/768; 257/769; 257/770
[58] Field of Search ............ 257/763, 768, 770, 767, 257/769

[56] References Cited

U.S. PATENT DOCUMENTS

| | | |
|---|---|---|
| 3,879,746 | 4/1975 | Fournier ............... 257/763 |
| 3,926,747 | 12/1975 | Newby et al. ............. 257/763 |
| 4,702,967 | 10/1987 | Black et al. .............. 257/763 |
| 5,130,764 | 7/1992 | Cetronio et al. ........... 257/763 |
| 5,260,603 | 11/1993 | Kamura et al. ............ 257/763 |

FOREIGN PATENT DOCUMENTS 58-75868  5/1983  Japan.
62-92323  4/1987  Japan.

Primary Examiner—Robert P. Limanek
Assistant Examiner—David Ostrowski
Attorney, Agent, or Firm—Ostrolenk, Faber, Gerb & Soffen

[57] ABSTRACT

A bipolar transistor fabricated on a silicon layer has a base electrode with a multi-layered structure implemented by a titanium film, a titanium nitride film, a platinum film and a gold film, and the platinum film is regulated to 5 to 30 nanometers thick for decreasing the thermal stress between the platinum film and the titanium nitride film equal to or greater than 50 nanometers, thereby preventing the bipolar transistor from damage due to heat applications in later stages.

6 Claims, 3 Drawing Sheets

SEMICONDUCTOR DEVICE WITH MULTI-LAYERED HEAT-RESISTIVE ELECTRODE IN TITANIUM-TITANIUM NITRIDE-PLANTINUM-GOLD SYSTEM

FIELD OF THE INVENTION

This invention relates to a semiconductor device and, more particularly, to a semiconductor device having a multi-layered heat-resistive electrode in a titanium-titanium nitride-platinum-gold system.

DESCRIPTION OF THE RELATED ART

A typical example of a multi-layered electrode is described in Japanese Patent Publication of Unexamined Application (Kokai) No. 58-75868, and the prior art multi-layered electrode is incorporated in a compound semiconductor device for providing an ohmic contact or a Schottky barrier. According to the Japanese Patent Publication of Unexamined Application, a p-type dopant impurity such as zinc is heavily diffused in an n-type gallium arsenide substrate, and titanium or titanium arsenide, titanium-nitride, platinum and gold are successively laminated over the major surface of the heavily doped p-type gallium arsenide region. If a Schottky barrier is required, the titanium or the titanium arsenide, the titanium-nitride, the platinum and the gold are directly deposited on the n-type gallium arsenide substrate. In both structures, the titanium film or the titanium arsenide film, the titanium-nitride film, the platinum film and the gold film are 50 nanometers, 50 to 100 nanometers, 100 to 200 nanometers and 500 to 1000 nanometers in thickness. Though not described in the Japanese Patent Publication of Unexamined Application, the titanium or titanium arsenide film, the titanium-nitride film, the platinum film and the gold film are assumed to be patterned in a multi-layered electrode. The Japanese Patent Publication of Unexamined Application describes that the titanium-nitride film provides a barrier against a thermal diffusion of platinum, and, accordingly, the titanium-nitride film does not allow the platinum to produce a platinum-arsenic compound and a platinum-gallium compound.

Japanese Patent Publication of Unexamined Application No. 62-92323 teaches a patterning process for the multi-layered electrode in the titanium-titanium nitride-platinum-gold system. The Japanese Patent Publication of Unexamined Application proposes to pattern the multi-layered structure in the titanium-titanium nitride-platinum-gold system through a dry etching, and gaseous etchant in a chlorine-fluorine system is used for producing plasma in the dry etching process.

However, a problem is encountered in the prior art multi-layered electrode in the titanium-titanium nitride-platinum-gold system in heat-resistance. In detail, the present inventor prepared the prior art multi-layered electrodes of semiconductor bipolar transistors serving as the base electrodes and the emitter electrodes. The titanium film, the titanium-nitride film, the platinum film and the gold film fell within the above ranges descried in Japanese Patent Publication of Unexamined Application No. 58-75868. Every twenty bipolar transistors were grouped, and the emitter-base junctions were reverse biased at 3 volts through the emitter and base electrodes in nitrogen ambience at 450 degrees in centigrade. The present inventor measured the leakage current $I_{EBO}$ across the emitter-base junction, and plotted the percentage of damaged bipolar transistors of each group. In the experiment, when the leakage current $I_{EBO}$ exceeded 10 micro-amperes, the present inventor determined the bipolar transistor as the damaged transistor.

FIG. 1 shows the percentage of the damaged bipolar transistors in terms of time. Small circles stand for the bipolar transistors with the emitter and base electrodes in the titanium-titanium nitride-platinum-gold system, and dots are indicative of the bipolar transistors with the emitter and base electrodes in the titanium-platinum-gold system.

As will be understood, the titanium-nitride films are rather more effective against the heat than those without the titanium-nitride film. However, titanium-nitride films lose the effect around 3.5 hours, and the percentage of damaged bipolar transistor exceeds 50 percent around 5 hours. The manufacturer must limit an application of the electrode thus easily damaged in a high-temperature ambience.

Another problem inherent in the prior art multi-layered electrode is difficulty in the patterning. Even though the dry etching process proposed in the Japanese Patent Publication of Unexamined Application is applied to the multi-layered structure, the etching rate of the platinum film is of the order of 34 nanometers per minute, and the manufacturer suffers from low productivity. Moreover, a silicon nitride film usually covers the major surface of the substrate for protecting component elements from the etchant. However, the etchant in the chlorine-fluorine system has small selectivity between the platinum and the silicon nitride. For this reason, the component elements are liable to be exposed, and the platinum film is less uniform in thickness.

SUMMARY OF THE INVENTION

It is therefore an important object of the present invention to provide a multi-layered electrode in the titanium-titanium nitride-platinum-gold system which is well resistant to heat and finely patterned through a lithographic process.

The present inventor contemplated the problems inherent in the prior art multi-layered electrode, and concluded that a thermal-stress between the titanium nitride film and the platinum film was the cause of the low thermal resistance. The present inventor found that the problems were solved by decreasing the thickness of the platinum film.

To accomplish the object, the present invention proposes to regulate the thickness of a platinum film between 5 nanometers and 50 nanometers.

In accordance with the present invention, there is provided a semiconductor device having a semiconductor element fabricated on a semiconductor substrate and an electrode formed on the semiconductor substrate, the electrode comprising a titanium film, a titanium nitride film formed on the titanium film, and having a thickness equal to or greater than 30 nanometers, a platinum film formed on the titanium nitride film, and having a thickness ranging from 5 nanometers and 50 nanometers, and a gold film formed on the platinum film.

It is desirable for the platinum film to range between 5 nanometers and 30 nanometers thick.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENT

Figure 1:
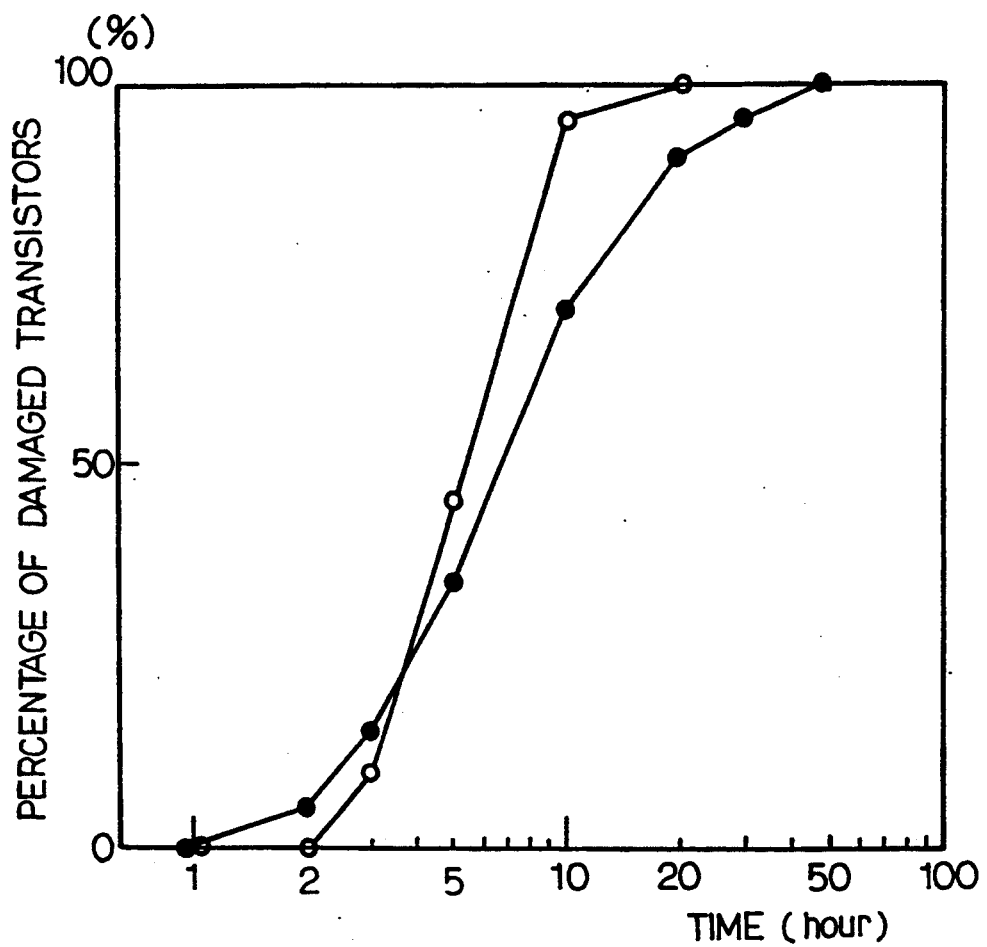
FIG. 1 is a graph showing the percentage of the damaged bipolar transistors having the prior art multi-layered electrodes.

Referring to FIGS. 2A to 2D of the drawings, a process sequence for fabricating a semiconductor device embodying the present invention starts with preparation of an n-type silicon layer 1 epitaxially grown on a silicon substrate, and the n-type silicon layer 1 is 1.0 ohm-cm in resistivity and 5 microns in thickness. Boron is selectively implanted into the n-type silicon layer 1 at a dose of $1 \times 10^{14}$ cm$^{-2}$ under an acceleration energy of 25 KeV. The boron-implanted silicon layer 1 is annealed in nitrogen ambience at 900 degrees centigrade for 30 minutes, and a p-type base region 2 is defined in the n-type silicon layer 1. In this instance, the p-type base region 2 is 0.35 micron in depth. In this instance, the n-type silicon layer 1 and the silicon substrate as a whole constitute a semiconductor substrate.

The n-type silicon layer 2 is placed in steam ambience at 900 degrees centigrade, and a silicon oxide film 3 is grown to 400 nanometers thick over the entire surface of the structure. An appropriate mask is patterned on the silicon oxide film 3, and a contact hole 4a is formed in the silicon oxide film 3. The contact hole 4a measures 2 by 30 microns in this instance. The mask is stripped off.

Subsequently, arsenic-doped polysilicon is deposited over the entire surface of the structure, and the arsenic-doped polysilicon film is held in contact with the p-type base region 2 through the contact hole 4a. The arsenic-doped polysilicon film is patterned into a dopant source 5, and the arsenic is diffused from the dopant source 5 into the p-type base region 2 in nitrogen ambience at 1000 degrees centigrade. The arsenic thus diffused into the base region 2 forms an n-type emitter region 6, and the n-type emitter region 6 is 0.1 micron in depth.

Figure 2A:
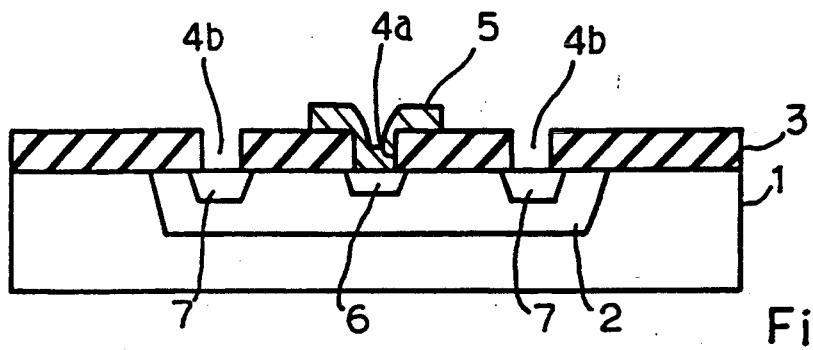
FIGS. 2A to 2D are cross sectional views showing a process sequence for fabricating a semiconductor device according to the present invention.

An appropriate mask is patterned on the silicon oxide film 3, and a contact hole 4b is formed around the dopant source 5. The mask is stripped off. Boron is ion implanted through the contact hole 4b into the p-type base region 2, and a heavily-doped p-type base contact region 7 is formed in the p-type base region 2. The resultant structure is illustrated in FIG. 2A.

A platinum film is sputtered over the entire surface of the structure to 20 nanometers thick, and the dopant source 5 of the arsenic-doped polysilicon is partially converted into a platinum silicide film 8 in nitrogen ambience at 500 degrees in centigrade. The residue of the platinum film is removed from the structure.

Figure 2B:
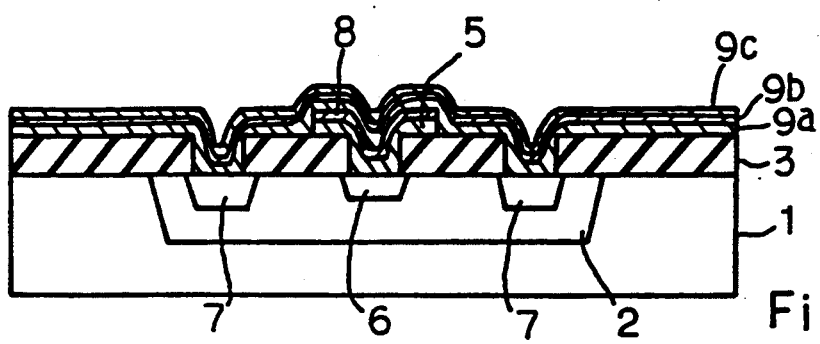

Titanium, titanium nitride and platinum are successively sputtered over the entire surface of the structure, and the titanium film 9a, the titanium nitride film 9b and the platinum film 9c topographically extend over the structure. For this reason, the titanium film 9a is held in contact with the heavily-doped p-type base contact region through the contact hole 4b, and the platinum silicide film 8 is covered with the titanium film 9a. The resultant structure is illustrated in FIG. 2B.

Photo-resist is spun onto the platinum film 9c, and the photo-resist film is patterned to a photo-resist mask 10. The photo-resist mask 10 exposes the platinum film 9c over the emitter region 6 and the base contact region 7.

Figure 2C:
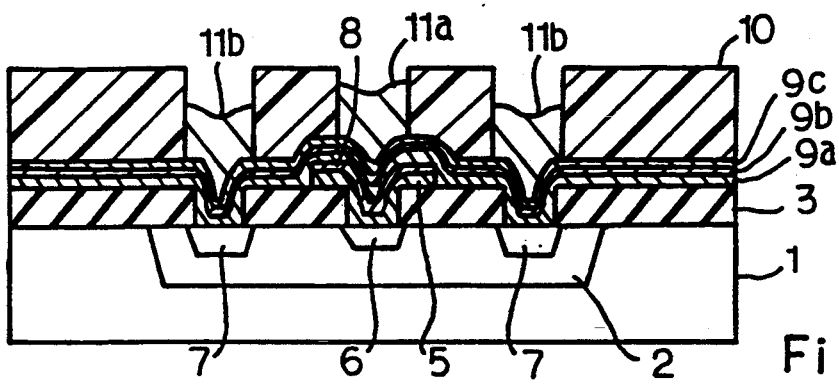

Gold is grown on exposed areas of the platinum film 9c through a plating in electrolyte, and gold films 11a and 11b are separately laminated on the exposed areas of the platinum film 9c as illustrated in FIG. 2C.

Figure 2D:
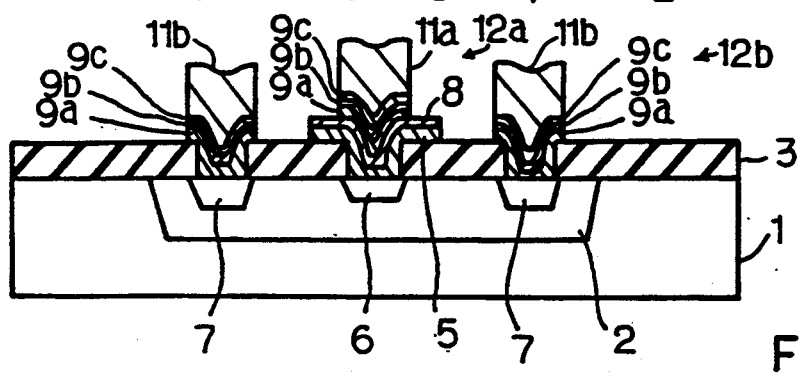

The photo-resist mask 10 is stripped off. Using the gold films 11a and 11b as a mask, the platinum film 9a, the titanium nitride film 9b and the titanium film 9c are partially removed through a dry etching process, and the emitter electrode 12a and the base electrode 12b are formed over the n-type emitter region 6 and the heavily-doped p-type base contact region 7 as illustrated in FIG. 2D. The chlorine-fluorine gas may be used for the dry etching process. The titanium film 9a, the titanium nitride film 9b, the platinum film 9c and the gold film 11a or 11b form in combination a multi-layered electrode, and the bipolar transistor serves as a semiconductor element. A plurality of bipolar transistors were formed by using the process sequence according to the present invention, and the heat resistance of each were evaluated in a similar way to the prior art bipolar transistors. In detail, the titanium film 9a, the titanium nitride film 9b, the platinum film 9c and the gold film 11a/11b were changed in thickness, and the bipolar transistors were grouped depending upon the multi-layered electrode as shown in Table 1.

TABLE 1

| Group | Ti (nm) | TiN (nm) | Pt (nm) | Au (nm) |
| --- | --- | --- | --- | --- |
| A | 100 | 30 | 120 | 500 |
| B | 100 | 30 | 50 | 500 |
| C | 100 | 30 | 30 | 500 |
| D | 100 | 50 | 40 | 500 |
| E | 100 | 50 | 30 | 500 |
| F | 100 | 50 | 20 | 500 |
| G | 100 | 75 | 30 | 500 |
| H | 100 | 75 | 10 | 500 |

Each group consisted of 20 bipolar transistors, and leakage current $I_{EBO}$ was measured under the application of the emitter-base reverse bias at 3 volts in the nitrogen ambience at 450 degrees in centigrade. If the leakage current $I_{EBO}$ exceeded 10 micro-amperes, the bipolar transistor was determined as a damaged transistor.

Figure 3:
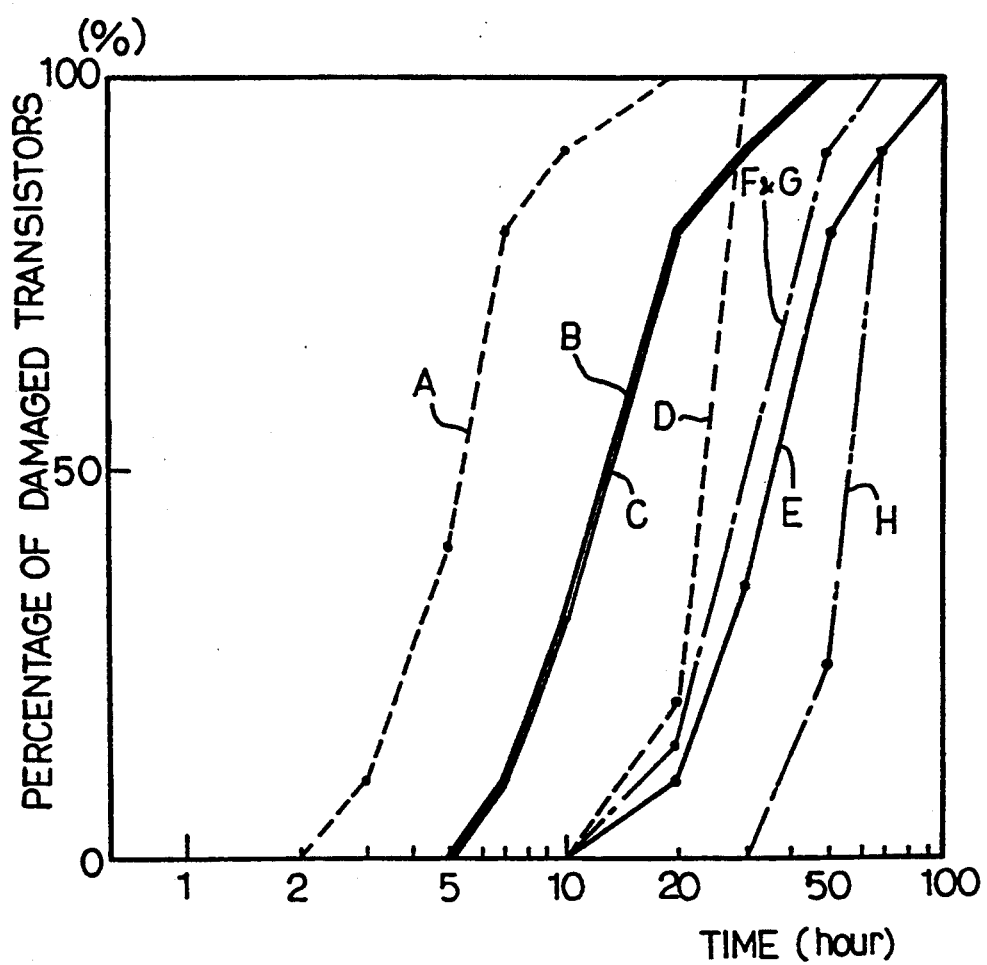
FIG. 3 is a graph showing the percentages of damaged transistors for exemplary groups of transistors shown in Table 1.

The percentage of the damaged transistors were plotted in FIG. 3, and Plots A, B, C, D, E, F, G and H stand for Groups A to G, respectively. Comparing Plots A to G in FIG. 3 with Plots in FIG. 1, the bipolar transistors of groups B to G achieve improved heat resistances. Namely, if the platinum film 9c is equal to or less than 50 microns in thickness, the titanium nitride film 9b of 30 nanometers thick withstands the thermal stress due to difference in thermal expansion coefficient therebetween, and the titanium nitride film 9b prevents the bipolar transistor from platinum diffusion from the platinum film 9c under the heat. In other words, the multi-layered electrode is well resistant to heat.

The thinner the platinum film 9c is, the smaller the thermal stress is. Therefore, there is no lower limit of the platinum film 9c in view of the thermal stress. However, if the platinum film 9c is less than 5 nanometers thick, the gold is hardly grown. For this reason, 5 microns is the minimum thickness of the platinum film 9c, and 50 nanometers is the maximum thickness of the platinum film 9c confirmed by the present inventor.

Moreover, if the platinum film 9c is equal to or less than 30 nanometers thick and the titanium nitride film 9b is equal to or greater than 50 nanometers, the heat resistance is drastically improved as indicated by Plots E to G. The manufacturer can apply heat to the bipolar transistors for at least 10 hours without damage, and the titanium nitride film 9b not greater than 50 nanometers and the platinum film 9c between 5 and 30 nanometers are more appropriate in view of the fabrication process for a semiconductor device.

The platinum film 9c of 10 nanometers thick, the titanium nitride film 9b of 75 nanometers thick and the titanium film 9a of 10 nanometers thick were patterned through the dry etching, the patterning on the platinum film 9c was completed within 30 seconds, and the etching speed for the titanium nitride film 9b was 300 nanometers per minute. Then, the dry etching patterned the multi-layered electrode within 2 minutes. The present inventor confirmed that the dry etching uniformly patterned the platinum film 9c of 5 to 30 nanometers thick. For this reason, the platinum film 9c of 5 to 30 nanometers thick is more appropriate in view of the uniformity of the platinum film 9c. Even though a silicon nitride film covers transistors fabricated on a substrate, the silicon nitride film does not expose the circuit component in so far as the platinum film 9c ranges from 5 microns to 30 microns thick. This results in that the etchant of the dry etching does not deteriorate the transistor characteristics.

As will be appreciated from the foregoing description, the platinum film not greater than 50 nanometers decreases the thermal stress, and the titanium nitride film effectively prevent a transistor from platinum diffusion from the platinum film under heat application.

Moreover, if the platinum film is decreased to 30 nanometers thick and the titanium nitride film is increased to 50 nanometers thick, the thermal resistance is drastically improved, and the platinum film is uniformly etched through the dry etching process.

Although a particular embodiment of the present invention has been shown and described, it will be obvious to those skilled in the art that various changes and modifications may be made without departing from the spirit and scope of the present invention. For example, the multi-layered electrode according to the present invention may serve as an electrode of a field effect transistor fabricated on either silicon or compound semiconductor substrate. The multi-layered electrode according to the present invention is available for a diode element.

What is claimed is:

1. A semiconductor device having a semiconductor element fabricated on a semiconductor substrate and an electrode formed on said semiconductor substrate, said electrode comprising
    a titanium film,
    a titanium nitride film formed on said titanium film, and having a thickness equal to or greater than 30 nanometers,
    a platinum film formed on said titanium nitride film, and having a thickness ranging from 5 nanometers to 50 nanometers, and
    a gold film formed on said platinum film.

2. The semiconductor device as set forth in claim 1, in which said electrode serves as a base electrode of a bipolar transistor fabricated on said semiconductor substrate.

3. The semiconductor device as set forth in claim 1, in which said titanium film is formed on a silicide film converted from a part of a semiconductor film formed on said semiconductor substrate.

4. The semiconductor device as set forth in claim 3, in which said silicide film and said semiconductor film are held in contact with said semiconductor substrate for serving as an emitter electrode of a bipolar transistor together with said electrode.

5. A semiconductor device having a semiconductor element fabricated on a semiconductor substrate and an electrode formed on said semiconductor substrate, said electrode comprising
    a titanium film,
    a titanium nitride film formed on said titanium film, and having a thickness equal to or greater than 50 nanometers,
    a platinum film formed on said titanium nitride film, and having a thickness ranging from 5 nanometers to 30 nanometers, and
    a gold film formed on said platinum film.

6. A semiconductor device having a semiconductor element fabricated on a silicon substrate and an electrode electrically connected to said silicon substrate, said electrode comprising
    a titanium film,
    a titanium nitride film formed on said titanium film, and having a thickness equal to or greater than 30 nanometers,
    a platinum film formed on said titanium nitride film, and having a thickness ranging from 5 nanometers to 50 nanometers, and
    a gold film formed on said platinum film.

* * * * *